United States Patent [19]
Franckart et al.

[11] Patent Number: 6,043,501
[45] Date of Patent: Mar. 28, 2000

[54] CONTINUOUS INPUT CELL FOR DATA ACQUISITION CIRCUITS

[75] Inventors: Jean-Pierre Franckart, Montignies-sur-Sambre; Henri Husson, Wanfercee-Baulet; Pierre Meunier, Mons, all of Belgium

[73] Assignee: Gec Alsthom Acec Transport S.A., Belgium

[21] Appl. No.: 08/952,151

[22] PCT Filed: Apr. 12, 1996

[86] PCT No.: PCT/BE96/00041

§ 371 Date: Jun. 4, 1998

§ 102(e) Date: Jun. 4, 1998

[87] PCT Pub. No.: WO96/33087

PCT Pub. Date: Oct. 24, 1996

[30] Foreign Application Priority Data

Apr. 19, 1995 [EP] European Pat. Off. ............... 95870038

[51] Int. Cl.$^7$ ........................ H03K 5/153; G02B 27/00

[52] U.S. Cl. .................. 250/551; 327/80; 246/28 F
[58] Field of Search ................. 250/551, 208.4, 250/208.5, 214 SW; 307/130; 246/28 F; 327/80, 77

[56] References Cited

U.S. PATENT DOCUMENTS

| 4,091,292 | 5/1978 | Sibley | 307/130 |
| 4,247,790 | 1/1981 | Sahasrabudhe et al. | 327/80 |

Primary Examiner—Edward P. Westin
Assistant Examiner—Thanh X Luu
Attorney, Agent, or Firm—Knobbe, Martens, Olson & Bear, LLP

[57] ABSTRACT

A continuous input cell for data acquisition circuits, particularly in railway applications. The cell consists of at least two parallel lines of identical elements, and each line includes at least one Zener diode (DZ1 or DZ2), a switch (SW1 or SW2) preferably consisting of an optocoupler (U1 or U2), and an optocoupler (U3 or U4) including an LED.

10 Claims, 9 Drawing Sheets

CONTINUOUS INPUT CELL FOR DATA ACQUISITION CIRCUITS

SUBJECT OF THE INVENTION

The present invention relates essentially to a DC input cell intended for data acquisition circuits, more particularly in railway applications.

TECHNICAL BACKGROUND

Currently, DC input cells intended for data acquisition circuits essentially consist of mechanical safety relays which are connected together by simple cabling.

OBJECTS OF THE INVENTION

The present invention aims to provide a cell for DC inputs intended for data acquisition circuits, particularly in railway applications, which has at least equivalent behaviour in terms of safety to that of the prior art, while keeping inherent advantages of compactness, easier maintenance and fitting as well as greater longevity.

More particularly, the present invention aims to provide a cell in which misreading always errs on the side of safety.

The present invention also aims to detect malfunctions which may occur in the various constituent elements of the cell.

The present invention furthermore aims to minimize the influence of a variation in the characteristics of the components which are used, under the effect of an external factor such as a rise in temperature, for example.

PRINCIPLE CHARACTERISTICS OF THE PRESENT INVENTION

The present invention relates essentially to a DC input cell intended for data acquisition circuits, particularly in railway applications, consisting of electronic components and comprising at least two lines of identical elements. Each line is essentially composed of a Zener diode, a switch, preferably produced by an optocoupler, and a second optocoupler comprising an LED diode.

The voltage thresholding is carried out by comparing the input voltage with the reference voltage of the Zener diode, while the DC isolation is provided by the optocouplers.

According to a first embodiment, the two optocouplers comprising the LED diode are arranged in parallel so that data is exchanged between the two lines so as to check the integrity of the system.

According to another preferred embodiment, the two optocouplers are arranged in series head-to-tail, each of them being arranged in parallel with a diode, the two diodes being reverse-biased with respect to the corresponding optocoupler in order to allow current to flow when the corresponding optocoupler is not conducting.

According to a further preferred embodiment, each diode in parallel with an optocoupler comprising the LED diode is replaced by a first resistor, the two first resistors present in each of the lines being strictly identical.

According to a further preferred embodiment, a second Zener diode is provided in each line, where it is arranged in parallel with the first Zener diode followed by the optocoupler fulfilling the function of a switch.

This second Zener diode has the purpose of preventing the reverse voltage of one of the LED diodes of the optocouplers from reaching its minimum breakdown voltage.

According to a further preferred embodiment, a second resistor is placed in series with the optocoupler comprising the LED diode and in parallel with the first resistor, the two second resistors present in each of the lines being also strictly identical.

According to a further preferred embodiment, one of the two lines has a buffer stage with transistor which makes it possible to invert the level of the output impedances, in order to allow the detection of a divergence between the various processing lines in the event that the outputs of the plurality of identical cells are set in parallel by parasitic elements. In this case, this configuration makes it possible to detect a divergence in the event that the various cells are in different states.

BRIEF DESCRIPTION OF THE FIGURES

The present invention will be described in more detail with the aid of the following figures.

DESCRIPTION OF A PREFERRED EMBODIMENT OF THE PRESENT INVENTION

In order to understand the principles underlying the design of the device according to the present invention, reference will be made essentially to FIGS. 1, 2, 3 and 4 which incorporate the principle characteristic elements.

Figure 1:
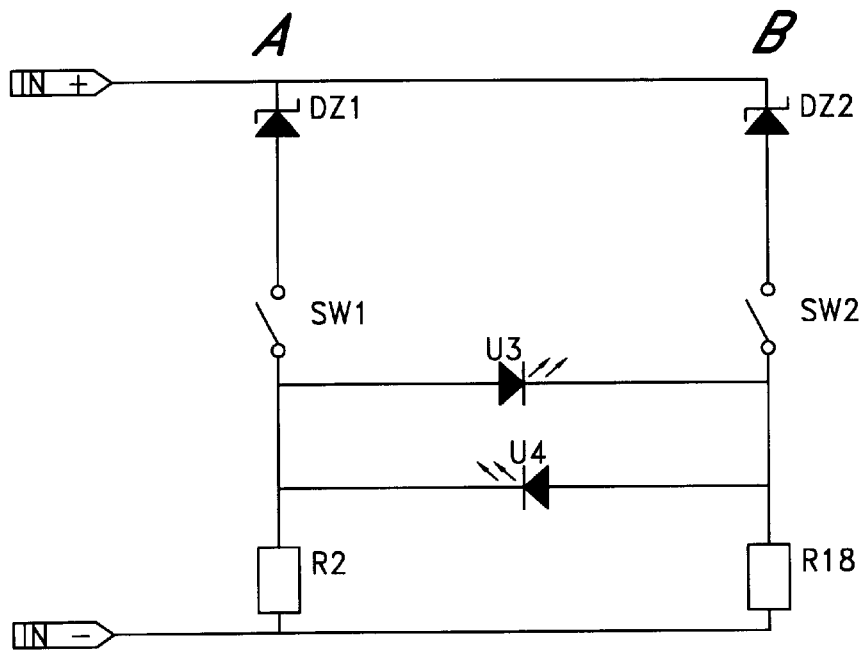
FIGS. 1, 2, 3 and 4 represent outline diagrams which show the essential elements constituting a device according to the present invention.

The device according to the present invention, commonly referred to as a DC input cell, as represented in FIG. 1 essentially consists of two parallel lines of identical elements arranged in series.

The first line, referred to as line A, comprises a Zener diode DZ1, a switch SW1 which is preferably an optocoupler, a second optocoupler U3 comprising an LED diode as well as a resistor R18, while the second line, referred to as line B, comprises a Zener diode DZ2, a switch SW2 which is preferably an optocoupler, a second optocoupler U4 comprising an LED diode as well as a resistor R2.

According to this configuration, it is the Zener diodes DZ1 or DZ2 which make it possible to determine the reference threshold. The main drawback of this device resides in the fact that the consumption guaranteed at the threshold depends strongly on the sensitivity of the optocouplers U3 and U4.

This is the reason why it is proposed to split the lines of elements. According to the particular configuration presented in FIG. 1, the two optocouplers U3 and U4 are arranged in parallel, so that there is a continuous exchange of data between the two lines so as to check the integrity of the system.

Figure 2:
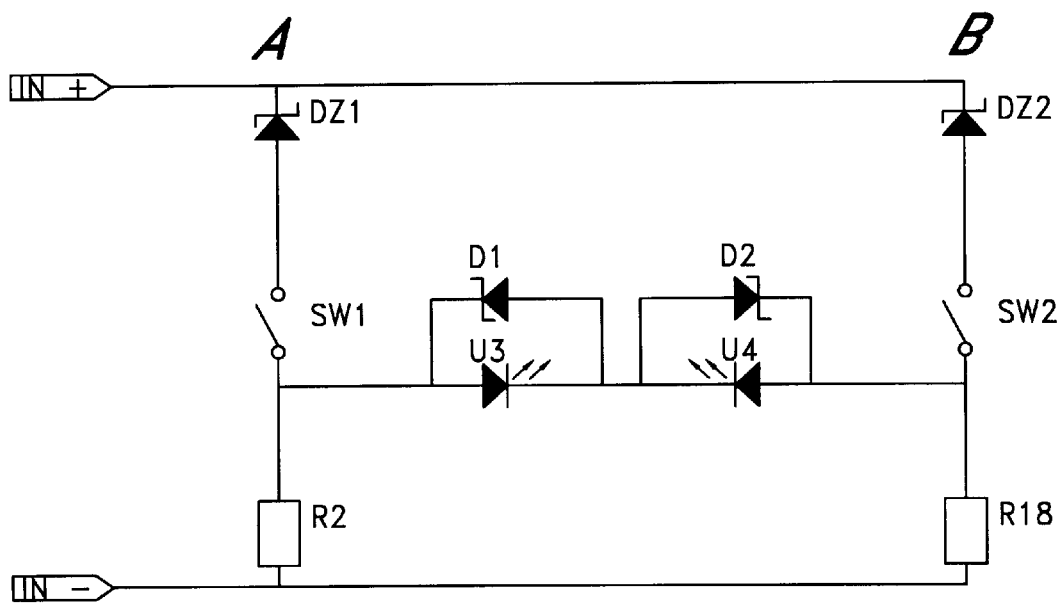

According to another embodiment, which is more particularly represented in FIG. 2, the two optocouplers are no longer arranged in parallel, but are arranged head-to-tail. In this case, it is clear that it was necessary to arrange a diode in parallel on each of the optocouplers U3 and U4. More particularly, a diode D1 is arranged in parallel with the optocoupler U3, while a diode D2 is in parallel with the optocoupler U4. It is again clear that the two diodes are in opposite directions.

According to another further preferred embodiment, the diodes D1 and D2 have been replaced by resistors.

To explain this, in the case of a scheme including diodes, it should be noted that there is a lack of current threshold for the emission of the LED diode. Although the diode does indeed have a dark current, this remains unusable.

Figure 3:
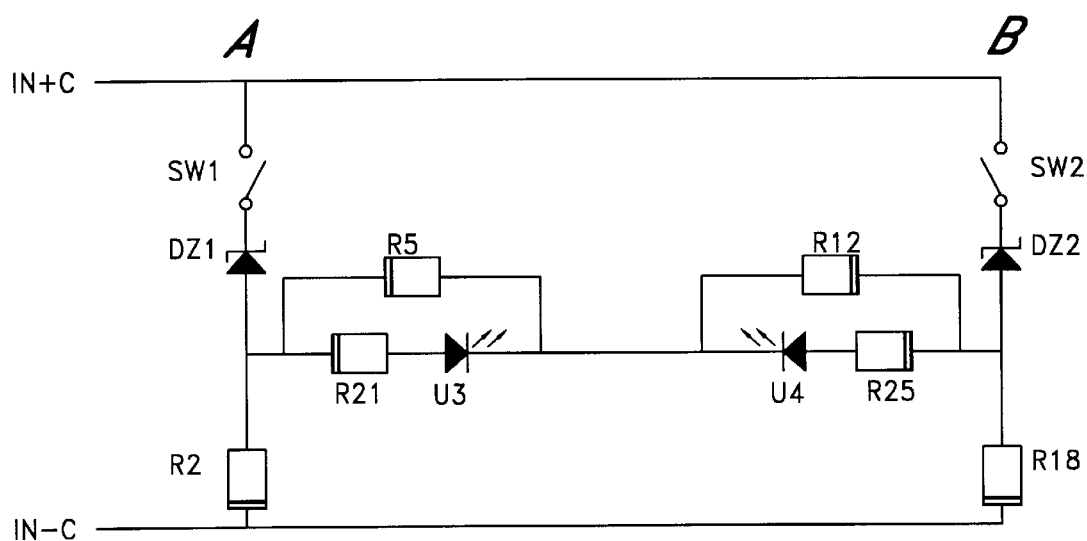

As represented in FIG. 3, by proposing to remove the diodes D1 and D2 as represented in FIG. 2 and replacing them by strictly identical first resistors R5 and R12, a guarantee is obtained of minimum current consumption at the threshold for a minimum voltage of 1V across the terminals of the LEDs of U3 and U4 when the latter switch. This means that, in order for a diode to emit, the voltage needs to reach the 1V threshold, and the current will flow through the resistor of the opposite line. In this way, there will not be an abnormally high voltage.

The first resistors RS and R12 therefore have the task of guaranteeing a minimum current consumption at the threshold.

Another improvement consists in providing the addition of Zener diodes DZ3 and DZ4 in parallel, on the one hand with the Zener diode DZ1 and the switch SW1, and on the other hand with the diode DZ2 and the switch SW2. To explain this, it should be noted that the guarantee of a minimum consumption is based on the presence of the resistors R5 and R12, and that increasing the value of one of the two resistors leads to an increase in the voltage threshold of the cell. A total break of one of the resistors R5 or R12 is normally detected by the fact that the corresponding optocoupler U3 or U4 cannot be turned on.

Nevertheless, in the event that the input voltage exceeds a certain threshold, which corresponds to the minimum breakdown voltage of the LED of the optocoupler U3 or U4, it is possible to see operation as being correct in the event that the LED of the optocoupler driven in reverse starts to conduct through breakdown.

The role of the Zener diodes DZ3 and DZ4 is therefore to prevent the reverse voltage on one of the LEDs of the optocouplers U3 and U4 from reaching the minimum breakdown voltage of the LEDs of the optocouplers. The presence and the value of the Zener diodes DZ3 and DZ4 are monitored by the optocouplers U3 and U4 during the scanning phases when SW2 and SW1 are both in the open state.

Another improvement, represented in FIG. 3, consists in providing in each of the lines A and B the presence of a second resistor in series with each of the optocouplers U3 and U4 comprising the LED diode, it being understood that these second resistors R21 and R25 are in parallel with the first resistors R5 and R12. Again, the second resistors R21 and R25 are strictly identical. The presence of these second resistors makes it possible to ensure that the reverse voltage which may arise across the terminals of the LED is always less than its breakdown voltage. This is because, if the resistor R12 breaks, the operation of the detection branch could be seen as normal by the processing lines if the LED of U2 enters a breakdown region (in practice, the reverse voltages which the LEDs of optocouplers can withstand are very small and rarely exceed a few volts).

Providing the presence of the second resistors R21 and R25 for the maximum input voltage, the reverse voltage which can arise across the terminals of the LED is always certain to be less than its breakdown voltage.

Figure 5A:
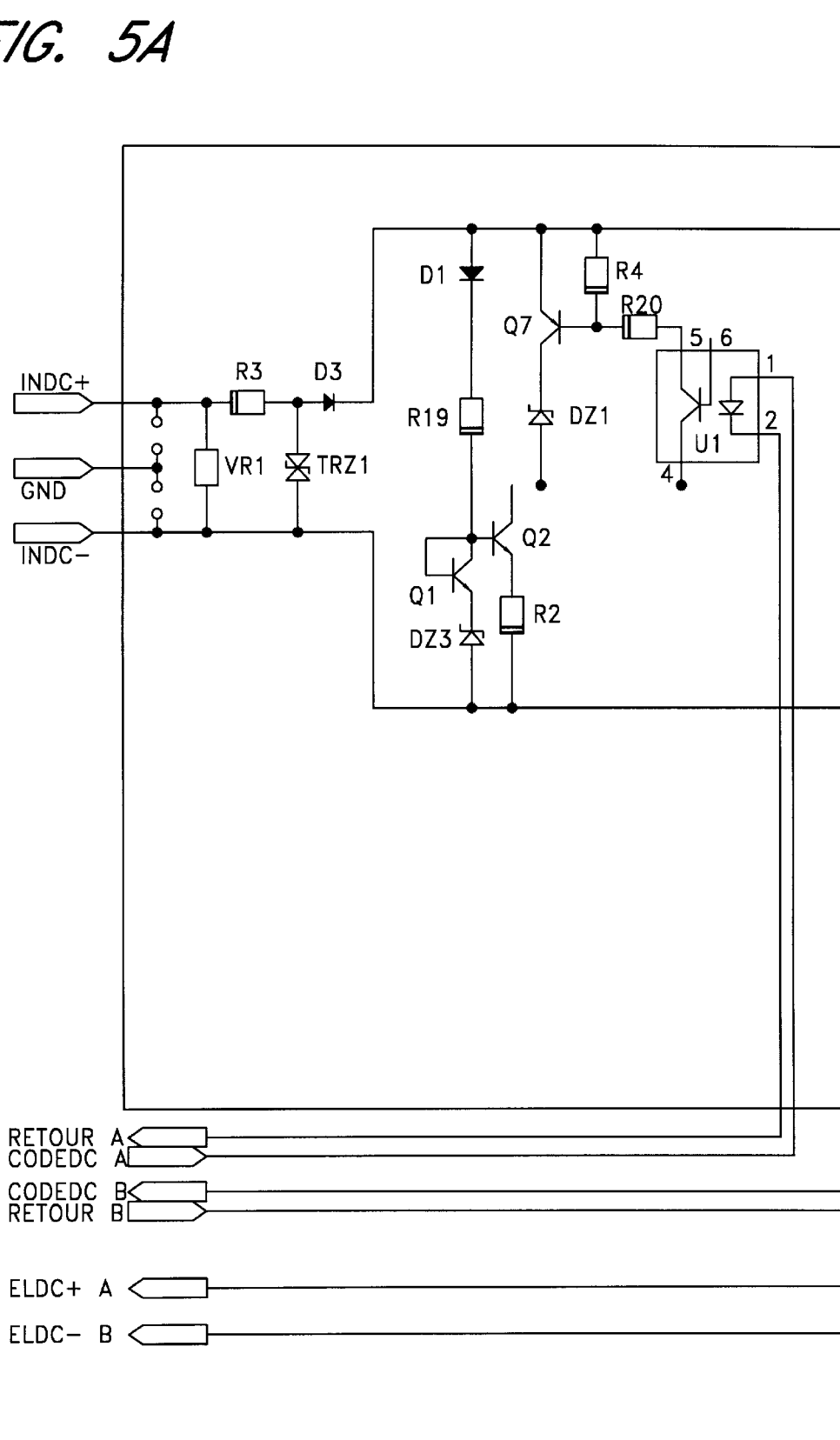
FIG. 5 represents one embodiment of the device according to the present invention implemented by applying the principles described in FIGS. 1 to 4.
Figure 5B:
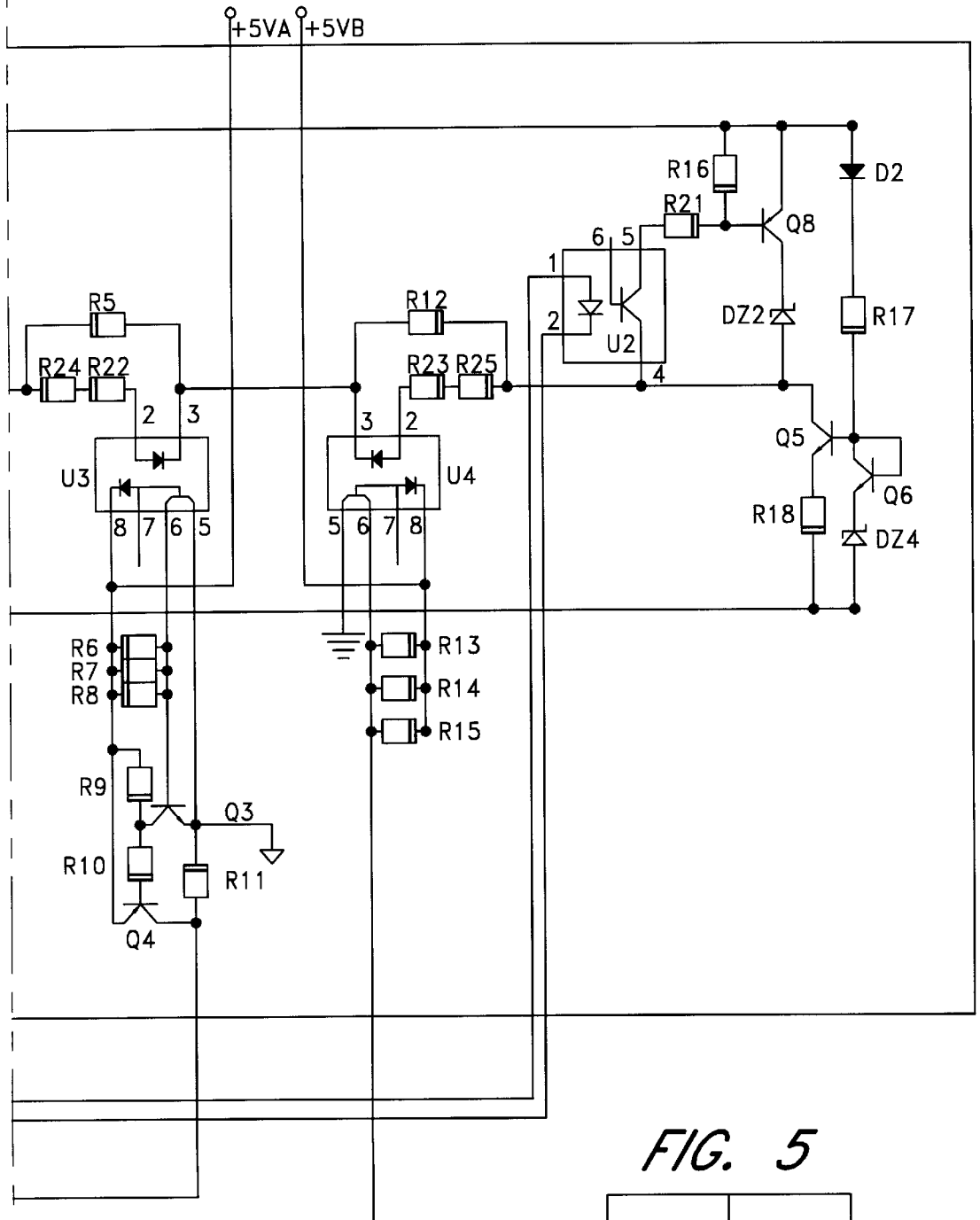
Figure 5:
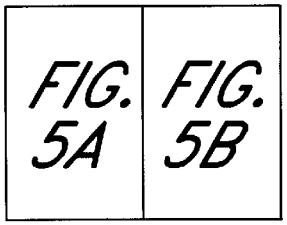

FIG. 5 represents a device according to the invention which puts into practice the principles described in the preceding figures.

The device described in FIG. 5 essentially consists of two functional units arranged in cascade. Unit 1 provides the minimum protection against the overvoltages and essentially consists of a resistor R3 which limits the amplitude of the current peaks of possible discharges in VR1, and the transzorb TRZ1 which clips the overvoltages occurring during possible discharges.

The second unit (Unit II) essentially fulfills the functions of voltage thresholding the cell and DC isolation between the input and the outputs of the processing lines as explained above.

According to the configuration represented in FIG. 5, the switches SW1 and SW2 described in the preceding figures are, in this case, optocouplers U1 and U2, while the resistors R18 and R2 have been replaced by injectors I1 and I2. The injector I1 is produced using the elements R17, Q6, Q5, DZ4 and R18, while the injector I2 consists of the elements R19, Q1, Q2, DZ3 and R2.

The Zener diode DZ1, the optocoupler U3 and the current injector I1 constitute the first reference threshold, while the second reference threshold is produced by the Zener diode DZ2, the optocoupler U4 and the current injector I2.

The optocouplers are programmed in such a way that, on each scan cycle of the DC input, the processing lines collaborate to drive U1 and U2 in the following sequence:

|        | U1    | U2    |
| ------ | ----- | ----- |
| Step 1 | "ON"  | "OFF" |
| Step 2 | "OFF" | "ON"  |
| Step 3 | "ON"  | "ON"  |
| Step 4 | "OFF" | "OFF" |

At the end of the scan cycle, one of the two optocouplers U1 or U2 is alternately left on.

At each step of the scanning cycle, the processing lines scan the logic state on the output collector of U3 and U4.

The decisions regarding the state of operation of the cell and on the logic state of the input voltage are taken as illustrated by the following tables:

| Case 1 | | |
| ------ | ----- | ----- |
|        | U3    | U4    |
| Step 1 | "OFF" | "OFF" |
| Step 2 | "OFF" | "OFF" |
| Step 3 | "OFF" | "OFF" |
| Step 4 | "OFF" | "OFF" |

The input is in the "0" logic state.

| Case 2 | | |
| ------ | ----- | ----- |
|        | U3    | U4    |
| Step 1 | "ON"  | "OFF" |
| Step 2 | "OFF" | "ON"  |
| Step 3 | "OFF" | "OFF" |
| Step 4 | "OFF" | "OFF" |

The input is in the "1" logic state.

In practice, the software proceeds as follows: once per cycle, the processors scan the inputs for 20 ms. They take 32 samples spaced by 625 μs. Outside this scanning phase, one of the switches is kept closed and the other open, in order to ensure permanent consumption. The position of the switches alternates at each cycle, and each line is on in turn.

According to a preferred embodiment, two separate scanning sequences are provided, where in each cycle, the processing lines change scanning sequence. Each scanning sequence is split into two phases: the first lasts 15 ms and the second 5 ms. The following notation is used:

P=number of samples read in the high state at the output of the optocoupler of line A (U1) during the 15 ms phase;

N=number of samples read in the high state at the output of the optocoupler of line B (U2) during the 15 ms phase;

P'=number of samples read in the high state at the output of the optocoupler of line A (U1) during the 5 ms phase;

N'=number of samples read in the high state at the output of the optocoupler of line B (U2) during the 5 ms phase;

Sequence 1

Figure 6:
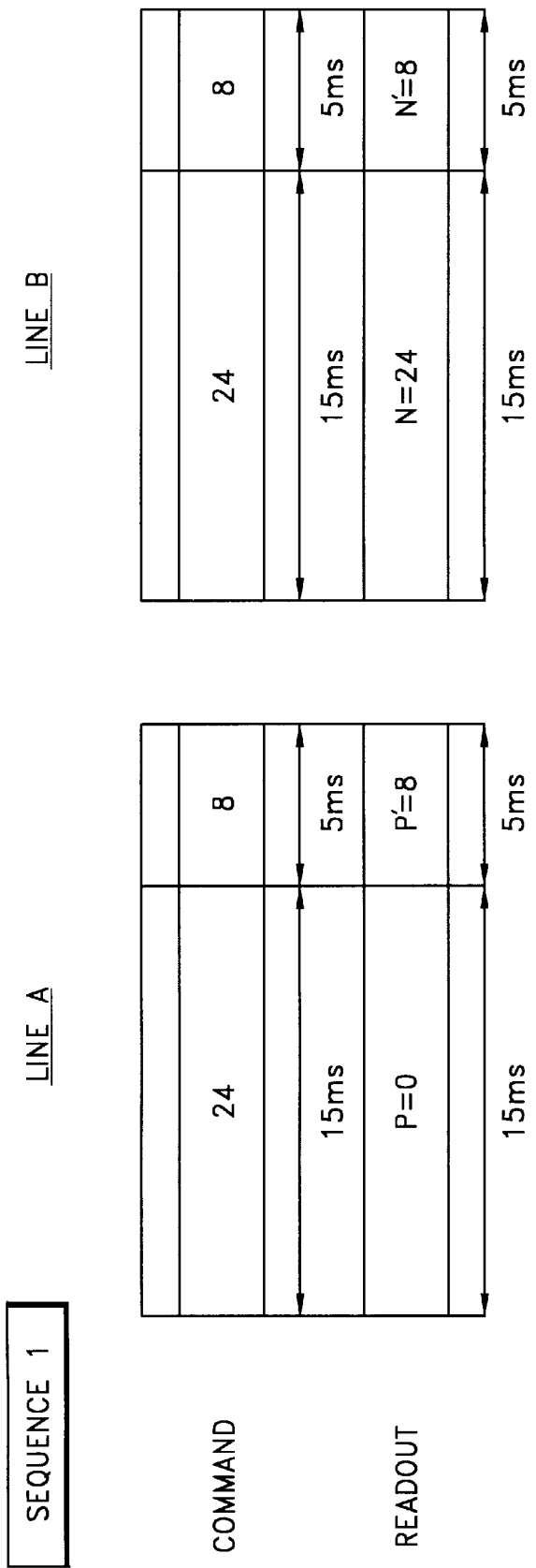
FIGS. 6 and 8 represent sequences of switch commands and readout in an illustrative embodiment of the software scanning the device according to the present invention.

FIG. 6 shows the commands applied to the two switches as well as the readouts at the output of the corresponding optocoupler. When the command is in the high state, the switch is closed. If the readout is in the low state, the optocoupler is on.

For each phase, FIG. 6 gives the number of samples in the high state which the processing lines read.

Figure 7:
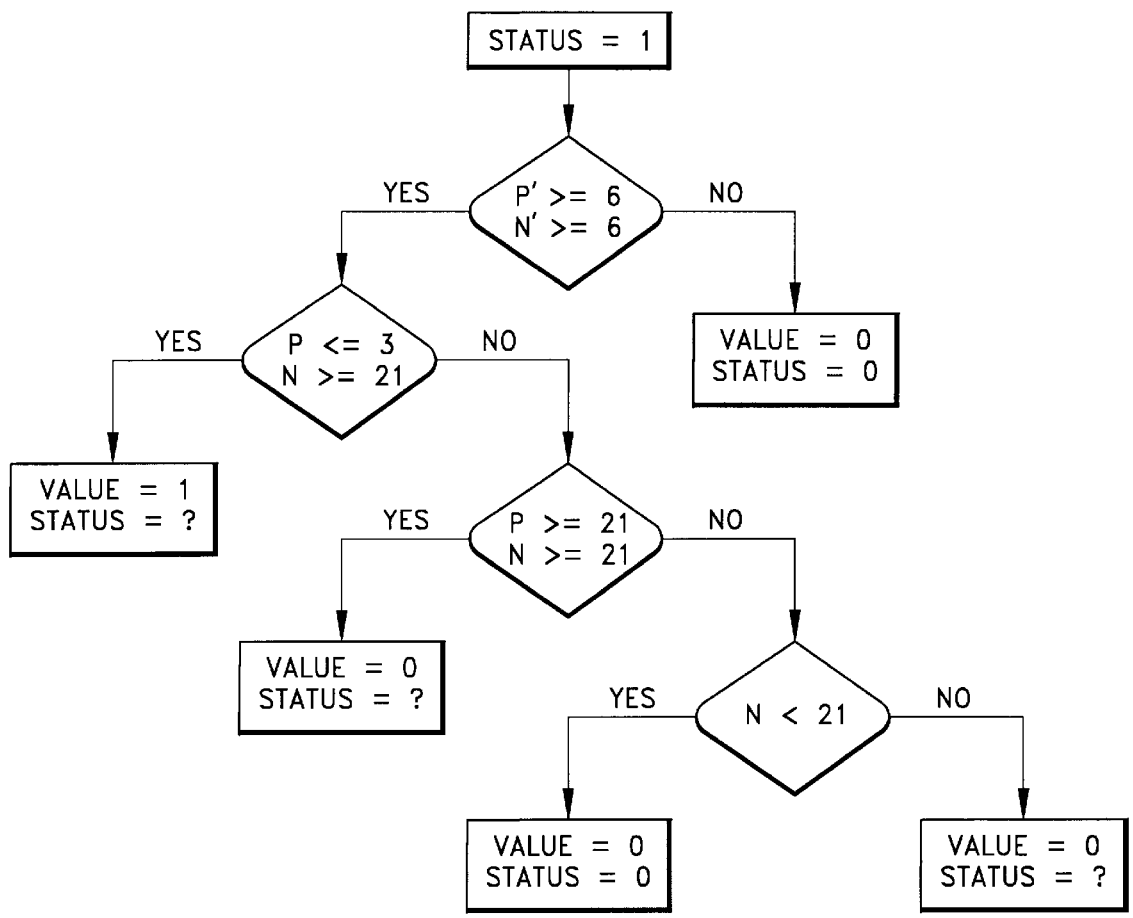
FIGS. 7 and 9 represent the sample processing flowcharts for the sequences respectively given in FIGS. 6 and 8.

FIG. 7 represents the flowchart of the processing of the samples for sequence 1, in which, during the 15 ms phase, only line A is on. If the input voltage is greater than the threshold, then the optocoupler U1 associated with line A should be on throughout this phase. This gives P=0 and N=24. During the 5 ms phase, the two switches are closed simultaneously. The optocouplers cannot conduct. In this case, P'=N'=8.

After each 20 ms scanning sequence, and on the basis of the number of samples in the high state which are counted by the microprocessor, the variables VALUE and STATUS are re-updated. The variable VALUE indicates whether the voltage applied to the cell is less than or greater than the threshold:

$$\begin{cases} \text{VALUE} = 0 \to U_{in} < U \text{ threshold} \\ \text{VALUE} = 1 \to U_{in} \geq U \text{ threshold} \end{cases}$$

The variable STATUS is an indicator of correct operation of the input cell:

$$\begin{cases} \text{STATUS} = 0 \to \text{fault detected} \\ \text{STATUS} = 1 \to \text{the cell is functioning correctly} \end{cases}$$

The binary variable which the software takes into account for the rest of the processing is VALUE*STATUS. The input cannot therefore ever be included in the event of a fault.

The sign ? indicates that the variable is not modified.

As shown by FIG. 7, certain discrepancies from the ideal number of samples are tolerated. These tolerances are essential to guarantee correct operation of the cell while taking account of the reaction times of the components (optocouplers, transistors, etc.) when a switch command changes.

Sequence 2

Figure 8:
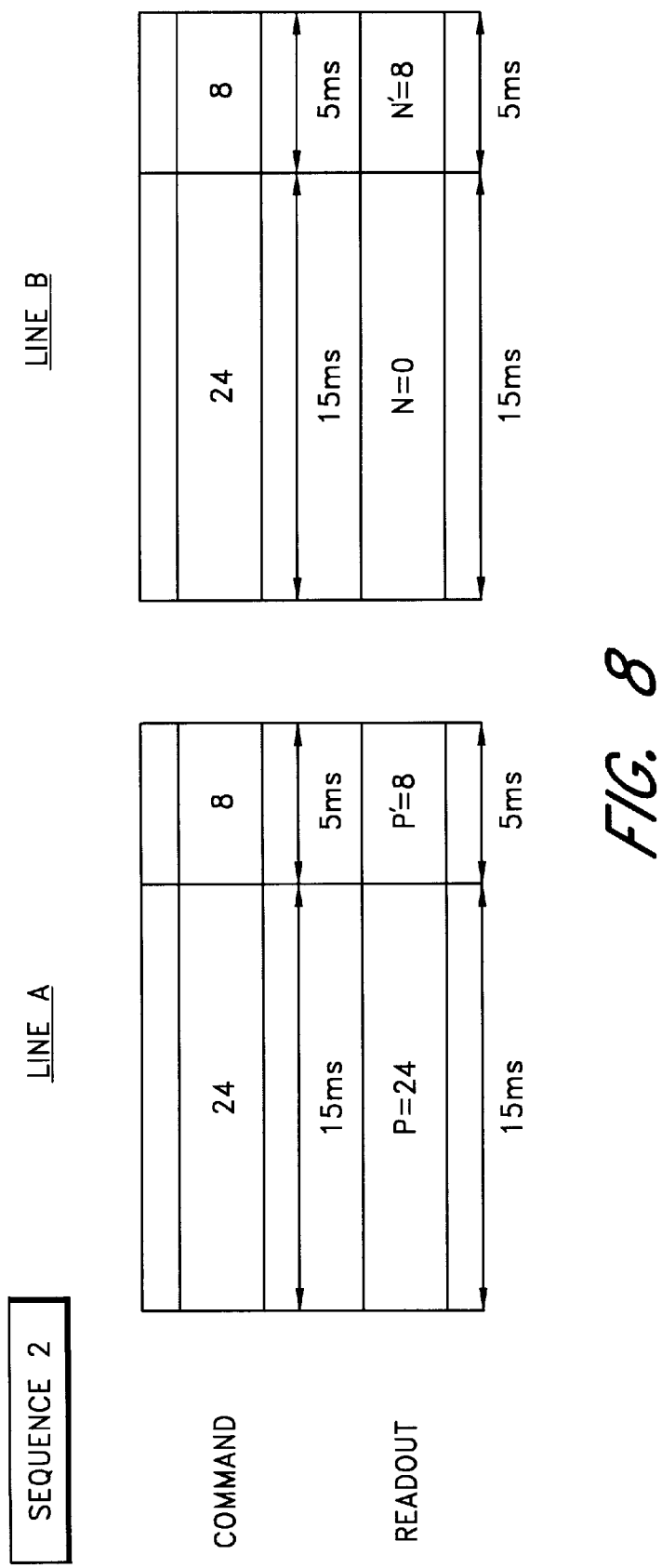

Sequence 2, as represented in FIG. 8, is the complement of Sequence 1. During the first 15 milliseconds, only line B is driven. During the last 5 milliseconds, the two lines are cut.

Figure 9:
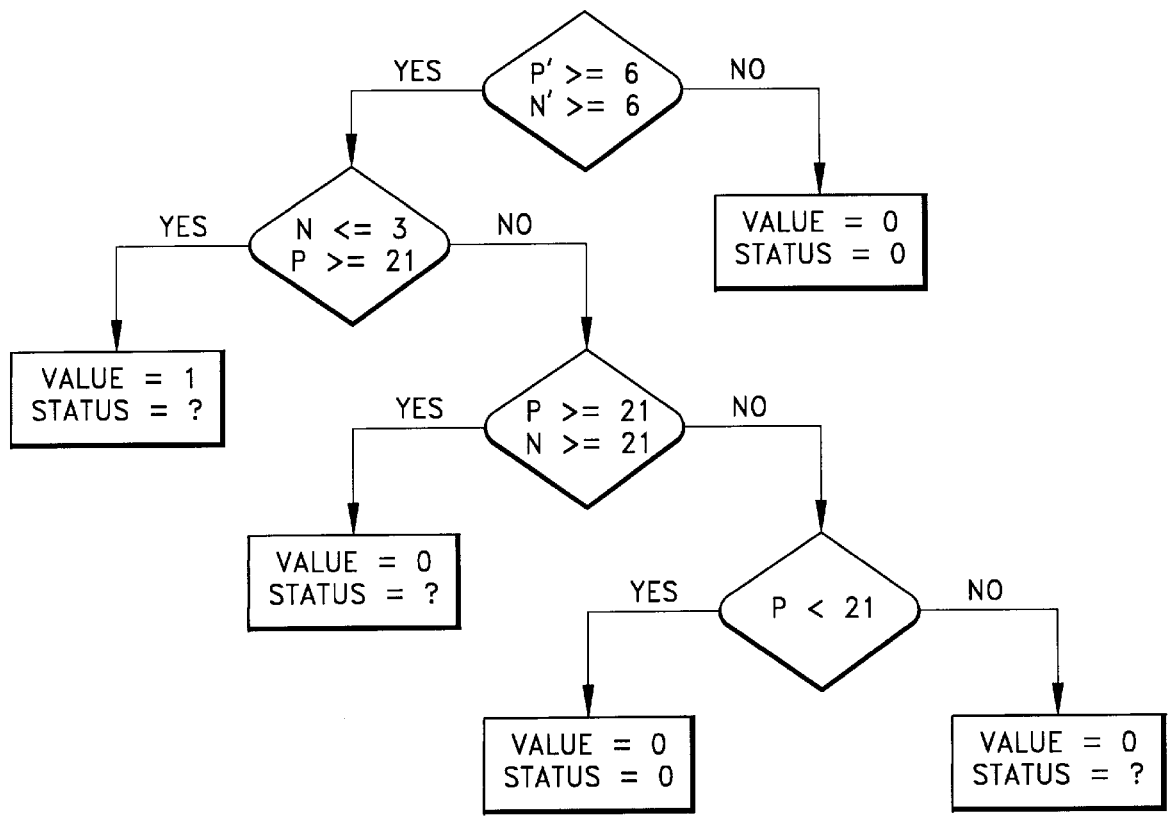

FIG. 9 represents the flowchart of the processing of the samples.

In order for the software to consider the input voltage to be greater than the threshold voltage, it is necessary that, during 4 successive scans (Sequence 1, Sequence 2, Sequence 1, Sequence 2), the result of the processing gives

VALUE*STATUS=1.

The use of scanning sequences of this type makes it possible to guarantee that the cell is insensitive to any 50 Hz AC voltage.

The principle selection criterion for the two optocouplers U1 and U2 fulfilling the function of switches is that of operating with the lowest possible LED current, which makes it possible to guarantee correct operation in switching. The other criterion which is essential for the selection of the optocouplers is that of obtaining minimum isolation between the input and the output.

Figure 4:
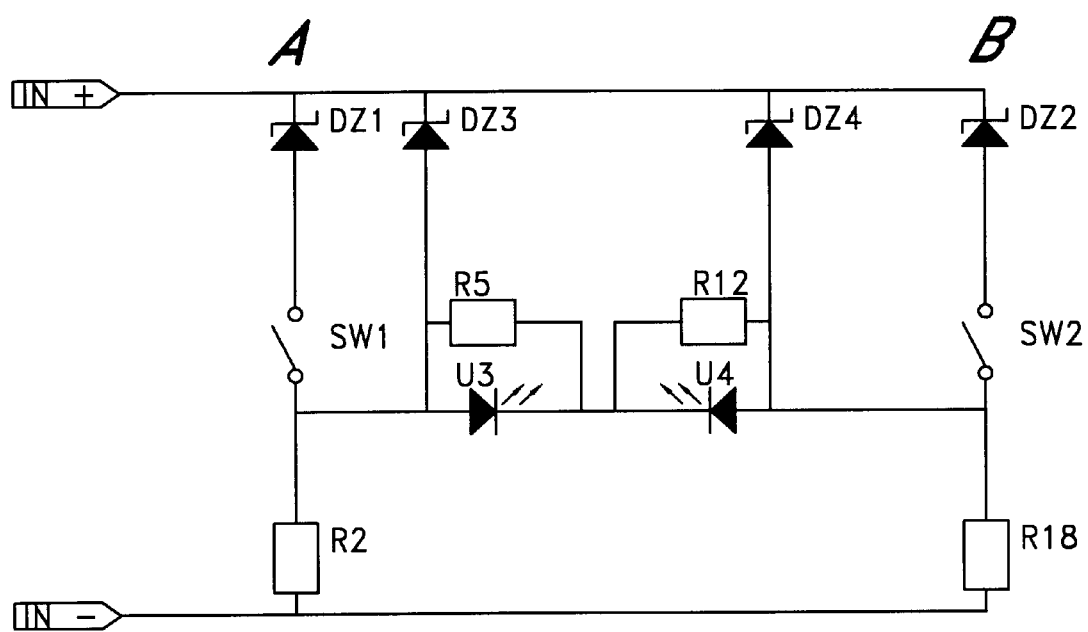

The useful signals at the output of the cell are naturally presented on the collectors of the output optocouplers with a high output impedance level for the "1" electrical state and a low impedance level for the "0" electrical state. This characteristic has the risk of producing an "OR" logic function (as regards the state of the inputs) for the two processing lines in the event of defects consisting in the occurrence of a short-circuit between the output signals of the various cells. One precaution consists in using, just for the processing line A as represented in FIG. 4, a buffer stage with transistor inverting the level of the output impedances so that there is this time a low impedance level for the "1" electrical state and a high impedance level for the "0" electrical state. This stage consists of the following elements: R9, Q3, R10 and Q4.

By thus creating an asymmetry between the two lines A and B, in the event of multiple parasitic conducting circuits occurring, possibly affecting the same cells for the two processing lines, the following behaviour is profited from: the equivalent of a wired OR function (at the electrical level) is produced on the cells of line A, while the equivalent of a wired AND (at the electrical level) is produced on the cells of line B.

This leads to a divergence between processing lines being detected as soon as the two cells affected by the parasitic conducting circuits are in different states.

We claim:

1. A DC input cell for scanning a DC input voltage across two DC inputs, the DC input cell comprising:
    at least two lines of substantially identical elements for being connected in parallel between DC inputs, each of the at least two lines comprising
        at least one Zener diode,
        at least one resistive element,
        an optocoupler comprising an LED arranged to connect the at least two lines to each other, and
        a switch consisting of a further optocoupler connected in series with the respective Zener diode.

2. A DC input cell according to claim 1, wherein the optocouplers which connect the two lines are arranged in parallel and opposite directions.

3. The DC input cell according to claim 1, wherein the optocouplers which connect the two lines are arranged in series and opposite directions and each of the optocouplers is arranged in parallel with a diode.

4. A DC input cell for use in scanning a DC input voltage across two DC inputs, comprising:

at least two lines of substantially identical elements, each line comprising at least one Zener diode, an optocoupler comprising an LED, and a switch consisting of a further optocoupler connected in series with the respective Zener diode;

wherein the two lines are arranged in parallel across the two DC inputs.

5. A DC input cell according to claim 4 wherein one of the optocouplers comprising an LED is arranged in parallel to the other optocoupler comprising an LED.

6. A DC input cell according to claim 4 wherein the optocouplers comprising an LED of each of the at least two lines are arranged in series, head-to-tail and further wherein each of the optocouplers comprising an LED of each of the at least two lines is arranged in parallel with a diode.

7. A DC input cell according to claim 4 wherein the optocouplers comprising an LED of each of the at least two lines are arranged in series, head-to-tail and further wherein the LEDs of the optocouplers are arranged in parallel with a first resistor.

8. A DC input cell according to claim 7 wherein each of said at least two lines further includes a second resistor arranged in series with the optocoupler comprising an LED and said second resistor being in parallel with said first resistor.

9. A DC input cell according to claim 4 wherein each of said at least two lines further comprises a second Zener diode in parallel with said one Zener diode.

10. A DC input cell according to claim 4 wherein one of said at least two lines further comprises a buffer stage having a transistor arranged to invert the level of the output impedance of that line.

* * * * *